United States Patent [19]

Barditch

[11] Patent Number: 4,575,820
[45] Date of Patent: Mar. 11, 1986

[54] OPTICAL INPUT WITH ELECTRICAL READOUT MEMORY MOSAIC

[76] Inventor: Irving F. Barditch, 4807 Rosecrest Ave., Baltimore, Md. 21215

[21] Appl. No.: 518,168

[22] Filed: Jul. 28, 1983

[51] Int. Cl.[4] ............................................. G11C 11/34
[52] U.S. Cl. ..................................... 365/114; 365/215
[58] Field of Search ................. 365/106, 114, 215, 234

[56] References Cited

U.S. PATENT DOCUMENTS 3,925,767 12/1975 Witteles et al. ...................... 365/114
4,362,805 12/1982 Landsman ......................... 365/106 X Primary Examiner—Joseph A. Popek
Attorney, Agent, or Firm—Anthony T. Lane; Robert P. Gibson; Michael C. Sachs

[57] ABSTRACT

A large scale integrated circuit device such as a random access memory or a read only memory has its top cover removed and information is read into the device in the form of radiation which is selectively applied to the exposed surface of the device. The radiation is of suitable frequency and intensity as to be capable of placing any of the individual devices within the array to a given logic state. The entire device is electrically read out in the normal fashion. The radiation may be modulated in any desired manner and can, for example, be modulated by a transparency containing the desired input information. Gray shades are obtained by employing a plurality of large scale integrated devices which are identical to one another and which receive the same radiation distribution with a different attenuation for each of the devices. The electrical readout process can then compare the state of respective identical devices within each array to determine gray shades.

5 Claims, 7 Drawing Figures

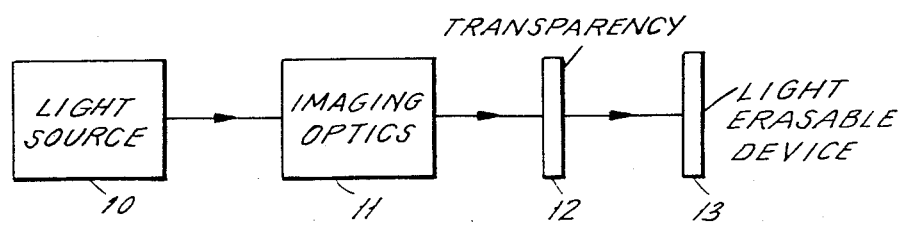
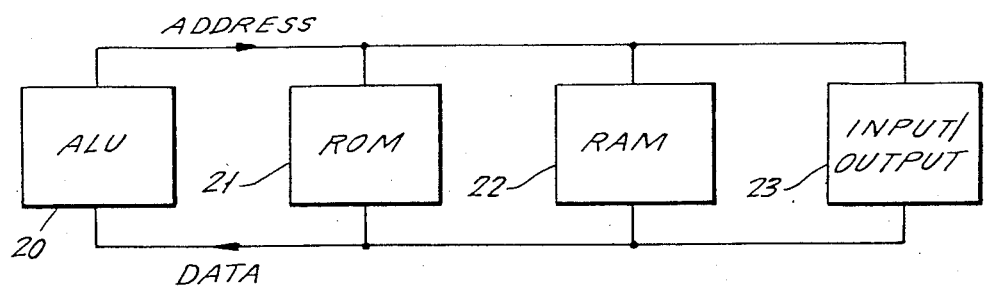
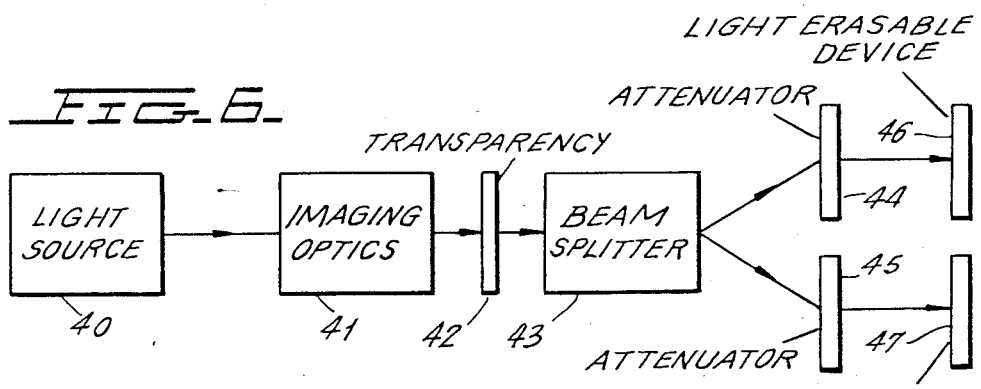
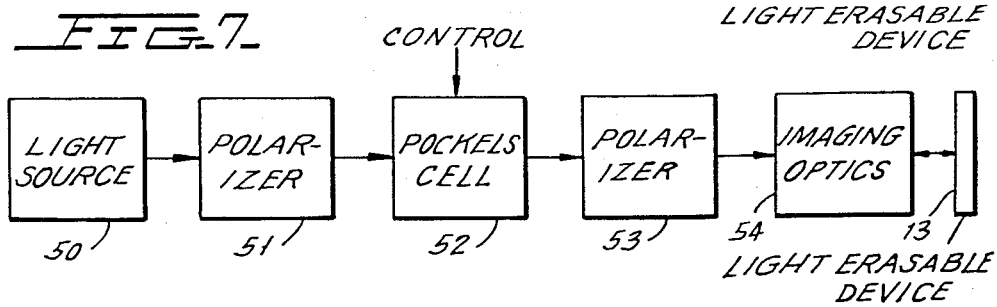

OPTICAL INPUT WITH ELECTRICAL READOUT MEMORY MOSAIC

GOVERNMENTAL INTEREST

The invention described herein may be manufactured, used and licensed by or for the Government for governmental purposes without the payment to me of any royalty thereon.

BACKGROUND OF THE INVENTION

This invention relates to a process and structure for applying information to large scale integrated devices by a suitably modulated optical input which will place the individual devices within the array in given logic states and for electrically reading out the information.

The application of digital binary information into a semiconductor memory element, ROM, photodiode, RAM, dynamic RAM or the like is well known. Where the information to be applied to the memory element is derived from an optical system, it is necessary to convert the optical information in digital form by use of photomultiplier tubes and photodiode arrays. These devices are complex and expensive and the output signal normally must be converted from analog form to digital form before it can be used. After conversion of the information to digital form, it is necessary to electrically apply the digital information to the individual elements of the mosaic which is a time-consuming operation.

BRIEF DESCRIPTION OF THE INVENTION

In accordance with the present invention, commercially available large scale integrated devices such as commercial ROMs, RAMs, EE PROMs and the like have their cover removed to expose the semiconductor chip within the device. A suitably spatially modulated radiation source is then focused on or scanned across the exposed chip surface so that the semiconductor junctions of the individual devices within the semiconductor chip will be either charged or discharged to a given logic state when the intensity of the radiation at that particular individual junction or device is at a suitable value. This is because all commercial devices of this type employ mosaics of PN junctions in silicon or other semiconductor material, which junctions are sensitive to radiant energy which will cause photoelectrons to appear at the junction and to be collected at the junction whether the junction is for a diode, a bipolar transistor or a field effect transistor. In operation, when light falls on the semiconductor mosaic and its individual devices which normally store either a 0 or a 1, if photoelectrons are generated in sufficient quantity by the radiation, they wipe out the storage property of the device, so that devices at a 1 state will drift to a 0 state.

The logic states of each device are then conventionally electrically read out when it is desired to determine or utilize the information which has been optically stored in the large scale integrated device. The readout occurs in the normal fashion, as by exciting the address half of the device in a given sequence and reading out the contents on a data bus in the manner specified for the particular device. The subsequent electrical readout of the stored state will indicate the presence of illumination greater than some predetermined value on that spot of the mosaic. When conventionally reading out the microprocessor or the storage element in its usual manner, there will then be a digital readout which describes the illumination pattern distribution over the full surface of the mosaic. Data handling in this fashion will be higher in speed than existing techniques, wherein information is electrically applied to the mosaic.

With the present invention, storage mosaic resolution can be of the order of 5 microns. The threshold level for a 1 or a 0 can be set by controlling the illumination level or the doping level of the memory chip, if desired. Shades of gray can be achieved by optically splitting the image onto several individual but identical memory elements each equipped with several levels of light attenuation. The outputs can then be read sequentially and properly combined to define gray shades. Since silicon is photosensitive, particularly in the near infrared spectral regions, phosphors can be added to the imaging optics, if desired, to translate visible or ultraviolet light into optimum wavelengths for the silicon photodiodes and photoconductive action.

Any presently produced microprocessor chip, when uncased, will work to at least some extent when excited by radiation in accordance with the invention. EE PROMs are especially adaptable to the present invention but virtually any large scale integrated arrangement such as those using CMOS techniques and transistor flip-flop storage can be used to advantage.

The present invention has general applicability but can be used, for example, as an inexpensive readout for a multichannel spectrometer, for a cathode ray tube picture or imaging system, or as a radiant energy motion detection device. When employed in these applications, it will be apparent that there is automatic optical-to-electrical conversion and the need for analog-to-digital converters is eliminated.

BRIEF DESCRIPTION OF THE DRAWINGS

FIG. 1 is a block diagram of the invention.

FIG. 2 is a block diagram of a typical microprocessor which can employ the present invention.

FIG. 6 is a block diagram of a second embodiment of the invention in which a plurality of light erasable devices are provided for obtaining gray shades.

FIG. 7 is a block diagram of a typical optical switching device which can be employed with the invention.

DETAILED DESCRIPTION OF THE INVENTION

Figure 3:
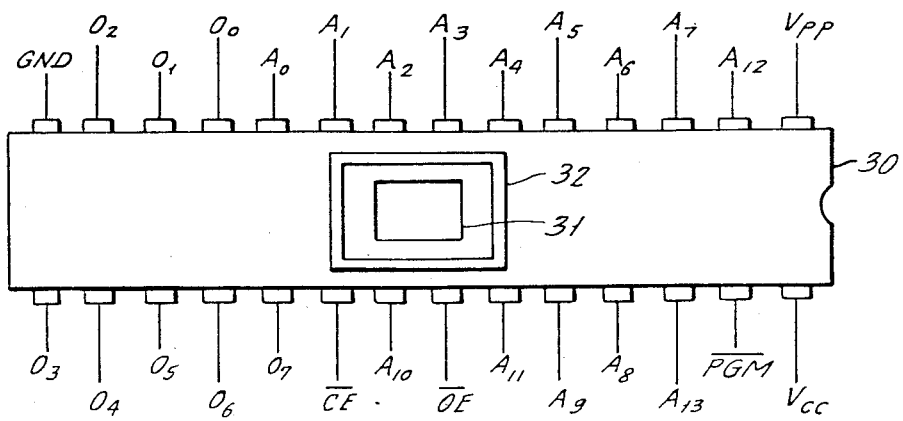
FIG. 3 is a plan view of an ultraviolet erasable PROM of commercial type which has its cover removed.

Referring first to FIG. 1, there is illustrated therein a conventional light source 10 which produces an output which might be rich in infrared if desired. The light source is applied through conventional imaging optics 11 to illuminate a transparency 12 which contains the spatial radiation distribution which is desired to be stored in a mosaic of light responsive junctions, hereinafter called a light erasable device 13. The imaging optics might also image the scene on the face of a video display on the device 13.

The light erasable device 13, in accordance with the present invention, can be a conventional large scale integrated device which can be a ROM, a RAM an EE PROM or the like. The device, however, is modified to have its cover removed so that the intensity modulated radiation passing through transparency 12 can be applied over the exposed surface of the semiconductor chip in order to produce an electrical distribution of states over the surface of the chip corresponding to the radiation distribution formed by transparency 12.

Typically, device 13 can include parts of the Intel 80/10 SBC microprocessor. This microprocessor is schematically illustrated in FIG. 2 and includes conventional arithmetic logic unit 20, read only memory 21, random access memory 22 and input/output circuits 23. The arithmetic logic unit 20 is connected to the components 21, 22 and 23 over an address line labeled "Address" and it obtains data from the components 21, 22 and 23 over the data line labeled "Data". The information on the address line will choose locations from which data is to be read within the devices 21, 22 and 23 in the usual manner. If the information distribution within the random access memory 22 is changed in some desired manner, the operation of the system will be appropriately modified.

In accordance with the present invention, the cover of commercial microprocessor device 13 is opened or removed so that at least the RAM portion 22 of the interior semiconductor chip is exposed to incident radiation. Conventionally, the chip surface facing the cover is the surface upon which all junctions terminate. The radiation is suitably spatially modulated to alter the distribution of information in the memory, as desired. Alternatively, the light input can be scanned and modulated to selectively alter information at different points within the memory.

By suitably applying radiation having an intensity greater than some given value, the individual PN junctions which come to the surface of the chip in the RAM section 22 are either charged or discharged, so that their logic states can be appropriately controlled. Before the chip surface is illuminated, the microprocessor can read, for example, a 1 into each position of RAM 22. Alternatively, the radiation source can flood the surface of the chip with light of sufficient intensity and frequency as to ensure that all individual devices are in the same logic state. After exposure to a suitable intensity modulated radiation source, only those individual elements which are exposed to a local modulated radiation source, for example, greater than some value will be switched from a logic 1 to a logic 0. Consequently, the information contained in the RAM 22 will correspond to the modulation distribution of the radiation source. The readout of the microprocessor of FIG. 2 is then carried out electrically and conventionally for the particular microprocessor.

Other devices which can be employed in place of the Intel 80/10 SBC microprocessor in FIG. 2 are a conventional Intel 8111 RAM. Thus, the cover of the RAM is removed to expose the surface of the chip, or the device may be purchased without the cover in place.

Figure 4:
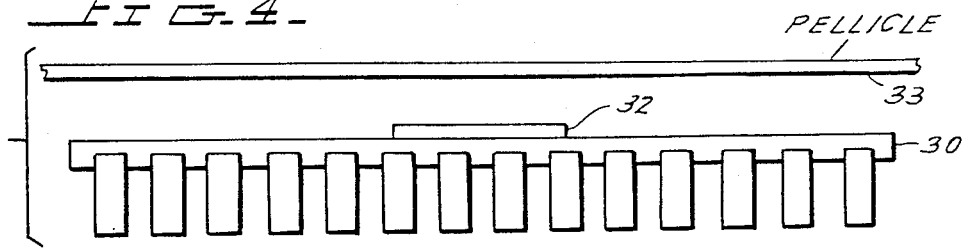
FIG. 4 is a side view of the ultraviolet erasable PROM of FIG. 3 with a dust protective pellicle in place.

Any other device can be appropriately modified. By way of example, FIGS. 3 and 4 show a standard Intel 27128 128k UV erasable PROM. The PROM has the appearance shown in FIG. 3 in plan view and the appearance shown in FIG. 4 in side view. The individual pins of the PROM are labeled in FIG. 3, wherein pins $A_0$ to $A_7$ are address pins; pin $\overline{CE}$ is a chip enable pin; pin $\overline{OE}$ is an output enable pin; pins $O_0$ to $O_7$ are output pins; pin $\overline{PGM}$ is a program pin. The UV erasable PROM consists of a substrate body 30 which carries a silicon chip 31 which contains a mosaic of PN junctions over its full surface, including at least 128,000 junctions, each corresponding to one bit of information which can be stored in the PROM. The device has a raised rim 32 which serves as a seat for a housing lid.

In accordance with one aspect of the invention, the housing cover is removed (and is not shown in FIGS. 3 and 4), so that the surface of the chip 31 is exposed to incident radiation. In order to keep dust from accumulating over the surface of chip 31, a pellicle 33 can be employed, as shown in FIG. 4. Other transparent sealing surfaces can be used.

Figure 5:
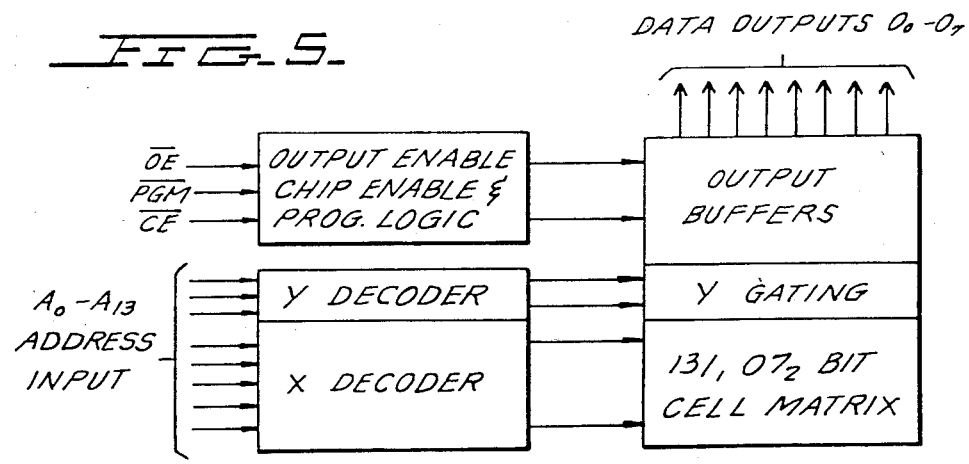
FIG. 5 is a block diagram of the operation of the PROM of FIGS. 3 and 4.

FIG. 5 is a block diagram of the PROM structure of FIGS. 3 and 4. The pin numbers of FIGS. 3 and 4 are also shown in FIG. 5 which illustrates the electrical readout operation for the device. In accordance with the invention, the surface of chip 31 is exposed to focused UV radiation which is appropriately spatially modulated in two dimensions in order to place the individual PROM elements or devices at a particular logic state, depending upon the intensity of the modulated radiation applied to that individual location.

FIG. 6 schematically illustrates imaging optics which can be employed to read information into the device of FIGS. 3 and 4 in accordance with the present invention. Optical systems such as those conventionally used for developing photoresist through masks for making large scale integrated circuit devices can be employed. Thus, in FIG. 6, there is provided a typical light source 40 which can be of any desired type. For many commercial devices, source 40 should contain a high percentage of its radiation in the infrared spectral region. The light source 40 is applied to suitable imaging optics 41, such as a microscope, and a transparency 42. Transparency 42 contains information regarding the distribution of the modulation which is to be applied over the fully exposed chip surface of the storage device. This information may, if desired, be passed through a suitable beam splitter 43 to produce two beams which are differently attenuated by the attenuators 44 and 45 which can be neutral density filters. The modulated light passing through the filters 44 and 45 is then applied to corresponding identical devices 46 and 47, respectively, with the same image information being applied to corresponding portions of the devices 46 and 47. Note that any desired number of beams with respective attenuators and light erasable devices can be employed in FIG. 6. Only two devices are shown for purposes of illustration.

Each of the individual devices 46 and 47 is electrically interrogated, sequentially, in order to establish the level of light intensity which is incident on each of the devices. By then comparing the output of the individual corresponding elements of the mosaic, it becomes possible to establish gray image shades in the output of the device.

The length of time the optical image is applied to the surface of the exposed chip should be appropriately controlled and should not be present during electrical readout of the chip. A light switch for this purpose is shown in FIG. 7 which also shows another embodiment of the invention. Thus, in FIG. 7, a light source 50 is provided which applies a radiation beam through polarizer 51, which beam is applied to a pockels cell 52. A suitable input electrical control is provided for the pockels cell 52 which will control the output light of the cell 52. The output light of cell 52 is then applied to a second polarizer 53 and the output of polarizer 53 is applied to imaging optics 54 which will scan the output beam of the polarizer 53 over the surface of light erasable device 13 with a raster type scan. The individual devices of the main device 13 will then have their logic states changed from 1 to 0, depending upon the instantaneous intensity of the light which is applied to that area which, in turn, depends upon the control signal applied to the pockels cell 52 at that instant. Thus, by suitably controlling the control signal at the pockels cell 52, it is possible to apply any desired logic state distribution over the surface of device 13. The same control can turn on or turn off the light when it fully images one scene on the entire chip surface, as in FIG. 6.

Although the present invention has been described in connection with a number of preferred embodiments thereof, many variations and modifications will now become apparent to those skilled in the art. It is preferred, therefore, that the present invention be limited not by the specific disclosure herein, but only by the appended claims.

What is claimed is:

1. A system for converting input signal information in the form of light radiation into corresponding electrical information; said system including a large scale integrated circuit semiconductor device having a surface which is exposed for receipt of incident radiation, said large scale integrated circuit semiconductor device comprising a plurality of discrete devices, and whereby application of radiation greater than a given intensity to said discrete devices places said discrete devices in the same given logic state; a source of light radiation; means for spatially modulating said source of radiation; optical means for directing said source of radiation towards and focusing radiation from said source, after modulation, onto said exposed surface of said semiconductor device so that said discrete devices are placed in a logic state dependent upon the intensity of the radiant energy within said modulated radiation which is applied thereto; and electrical readout means for reading out the logic state of each of said discrete devices after being exposed to said radiation which reading out also causes the erasing of said logic states stored in said devices.

2. The system of claim 1, wherein the semiconductor device is selected from the group consisting of random access memories, read only memories and programmable read only memories.

3. The system of claim 1, which includes a second semiconductor device identical to said semiconductor device, a beam splitter means for directing the said modulated radiation of said modulating means toward the surfaces of both said semiconductor devices, and light attenuating means for attenuating the light intensity applied to said second semiconductor device, whereby corresponding individual devices in said second semiconductor device which vary in logic state from those of said semiconductor device indicate changes in gray shades within said modulated image.

4. The method of writing information into a large scale integrated circuit device, having a semiconductor wafer, comprising the steps of: exposing the surface of the semiconductor wafer of said device so that incident light radiation can produce the effect of a gate voltage for each individual discrete device of the large scale integrated circuit device; spatially modulating light for writing said discrete devices; applying said spatially modulated light to said wafer surface to produce a pattern of states in said individual discrete devices which corresponds to the intensity distribution in the spatially modulated light; and thereafter electrically reading out said pattern of states.

5. The method of claim 4 which includes the further step of exposing the surface of a second semiconductor wafer which is identical to said semiconductor wafer to said spatially modulated light which is attenuated and electrically reading out the pattern of states in said second semiconductor wafer and comparing them to said pattern of states in said semiconductor wafer to determine gray shades in said spatially modulated light.

* * * * *